(12) United States Patent
Kirby

(10) Patent No.: US 7,931,769 B2
(45) Date of Patent: Apr. 26, 2011

(54) METHOD OF FORMING TEMPORARY CARRIER STRUCTURE AND ASSOCIATED RELEASE TECHNIQUES

(75) Inventor: Kyle Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 794 days.

(21) Appl. No.: 11/963,230

(22) Filed: Dec. 21, 2007

(65) Prior Publication Data

US 2009/0159208 A1 Jun. 25, 2009

(51) Int. Cl.
*B32B 37/00* (2006.01)

(52) U.S. Cl. ........ 156/155; 156/154; 156/247; 156/248; 156/257; 156/268; 156/344

(58) Field of Classification Search ............ 156/154, 156/155, 247, 248, 250, 268, 257, 344
See application file for complete search history.

(56) References Cited

U.S. PATENT DOCUMENTS 3,555,659 A * 1/1971 Mracek .................. 29/825

OTHER PUBLICATIONS

Derwent abstract of TW 444368, published by Derwent in 2002 (TW 444368 published Jul. 1, 2001).*

* cited by examiner

*Primary Examiner* — Jeff H Aftergut
(74) *Attorney, Agent, or Firm* — Perkins Coie LLP

(57) ABSTRACT

A method of forming a temporary carrier structure is disclosed which includes forming a plurality of recesses in a carrier structure, the recesses extending to a depth that is less than a thickness of the carrier structure, forming a dissolvable material in the recesses and above a first surface of the carrier structure, securing a thin substrate above the first surface of the carrier structure using the dissolvable material to secure the thin substrate in place, performing at least one process operation on a second surface of the carrier structure to expose the dissolvable material in the recesses and contacting the exposed dissolvable material with a release agent so as to dissolve at least a portion of the dissolvable material.

21 Claims, 5 Drawing Sheets

METHOD OF FORMING TEMPORARY CARRIER STRUCTURE AND ASSOCIATED RELEASE TECHNIQUES

BACKGROUND

1. Technical Field

The present subject matter is generally directed to the manufacture and packaging of integrated circuit devices, and, more particularly, to a method of forming a temporary carrier structure and associated release techniques.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. Moreover, there is a constant demand to increase the packing density of integrated circuit devices such that the overall size of the consumer product employing such devices is reduced.

Generally, semiconductor wafers used in manufacturing integrated circuit devices, e.g., memory devices, microprocessors, etc., have traditionally had a diameter of approximately 200 mm and a thickness of about 750-1000 µm. Larger diameter wafers, e.g., 300 mm, are being used as well. In manufacturing integrated circuit devices, only a small portion of the overall thickness of the semiconductor wafer is actually used for the operational integrated circuit devices. For example, the junction depth on many modern integrated circuit devices may be 20 µm or less. Relatively thin substrates have been employed in manufacturing modern integrated circuit devices. However, handling and processing of such thin substrates can be problematic due to the lack of mechanical strength and rigidity inherent in such thin substrates.

The present subject matter is directed to a device and various methods that may solve, or at least reduce, some or all of the aforementioned problems.

BRIEF DESCRIPTION OF THE DRAWINGS

The subject matter disclosed herein may be understood by reference to the following description taken in conjunction with the accompanying drawings, in which like reference numerals identify like elements, and in which.

Figure 1:
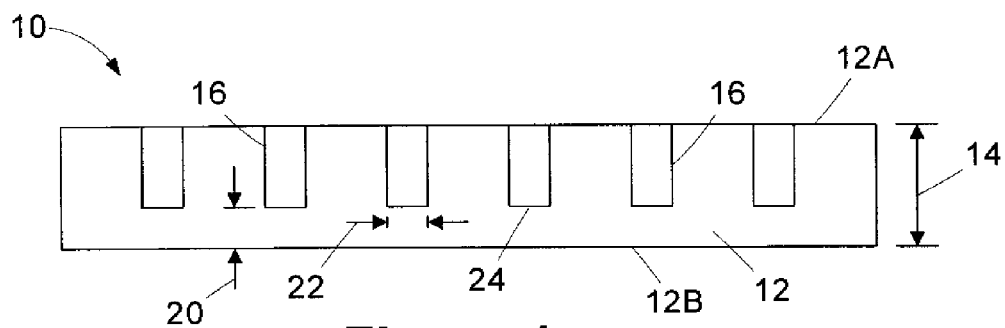
FIGS. 1-12 depict an illustrative carrier for thin substrates and illustrative release techniques as described herein.

While the subject matter described herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

One illustrative embodiment of a thin substrate carrier 10 is depicted in the attached figures in various stages of manufacture and use. As shown in FIG. 1, the substrate carrier 10 is comprised of a carrier structure 12 having a plurality of recesses 16 formed therein. The recesses 16 do not extend through the entire thickness 14 of carrier structure 12. The recesses 16 have a bottom surface 24. The carrier structure 12 has a first surface 12A and a second surface 12B. The carrier structure 12 may be comprised of a variety of different materials, e.g., silicon, glass, FR4, ceramic, etc., and it may have an overall thickness 14 that ranges from approximately 400-1000 µm. In one illustrative embodiment, the carrier structure 12 may be a silicon wafer commonly employed in the manufacture of integrated circuit devices.

Figure 2:
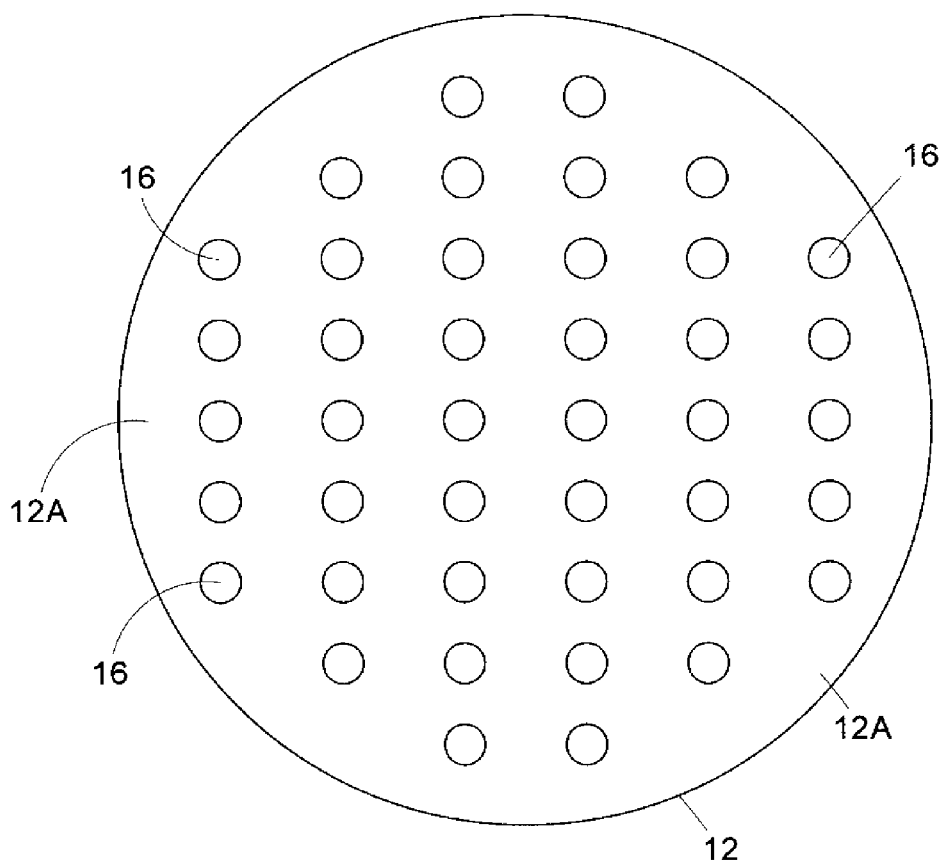

The size, shape and location of the recesses 16 may vary depending upon the particular application. In the depicted embodiment, the recesses 16 are generally cylindrically shaped recesses, although other shapes are also possible. As shown in FIG. 2, the recesses 16 may be formed in any desired pattern or arrangement in the carrier structure 12. As noted above, the recesses 16 do not extend all the way through the thickness 14 of the carrier structure 12. For example, in one illustrative embodiment, the bottom 24 of the recesses 16 may be formed such that the distance 20 from the backside 12B of the carrier structure 12 to the bottom surface 24 of the recesses 16 is approximately one-half the original thickness 14 of the carrier structure 12. In the case of the illustrative cylindrical recesses 16 disclosed herein, the recesses 16 may have a diameter 22 that ranges from approximately 100-200 µm. Of course, as stated earlier, the size, shape and configuration of the recesses 16 may vary depending upon the particular application. In general, the recesses 16 should be sized and positioned such that they can be employed as described herein. The recesses 16 may be formed using any of a variety of known processes, e.g., etching the recesses 16 through a masking layer (not shown), powder blasting, drilling, etc.

Figure 3:
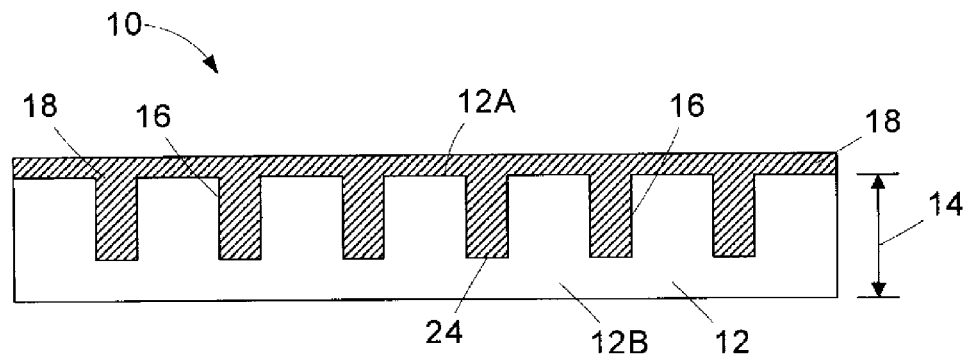
Figure 12:
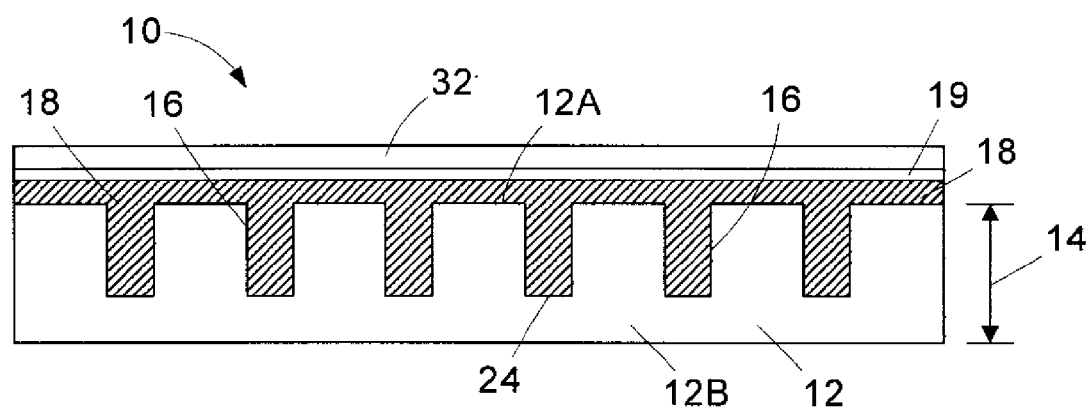

Next, as shown in FIG. 3, a layer of a dissolvable material 18 is formed in the recesses 16 and above the top surface 12A of the carrier structure 12. In one illustrative embodiment, the dissolvable material 18 is an adhesive material. The dissolvable material 18 may be any type of material, e.g., epoxy, spin-on polymer, a thermoplastic material, etc., that may be employed in securing a thin substrate (not shown in FIG. 3) to the carrier structure 12. The thickness of the dissolvable material 18 above the top surface 12A of the carrier structure 12 may vary depending upon the particular application. In some embodiments, the dissolvable material 18 may be the only material applied to the carrier structure 12. In other cases, the dissolvable material 18 may be a part of a multi-layer system employed to secure the thin substrate (not shown in FIG. 3) to the carrier structure 12. For example, as shown in FIG. 12, the dissolvable material 18 may be formed on the carrier structure 12, and a separate layer 19, e.g., an adhesive material, may be formed on the dissolvable material 18. In this illustrative example, the dissolvable material 18 may be a photoresist material, or other materials that are dissolvable by contact with a release agent, e.g., a solvent, an acid, water, etc., or a combination of such materials.

Figure 4:
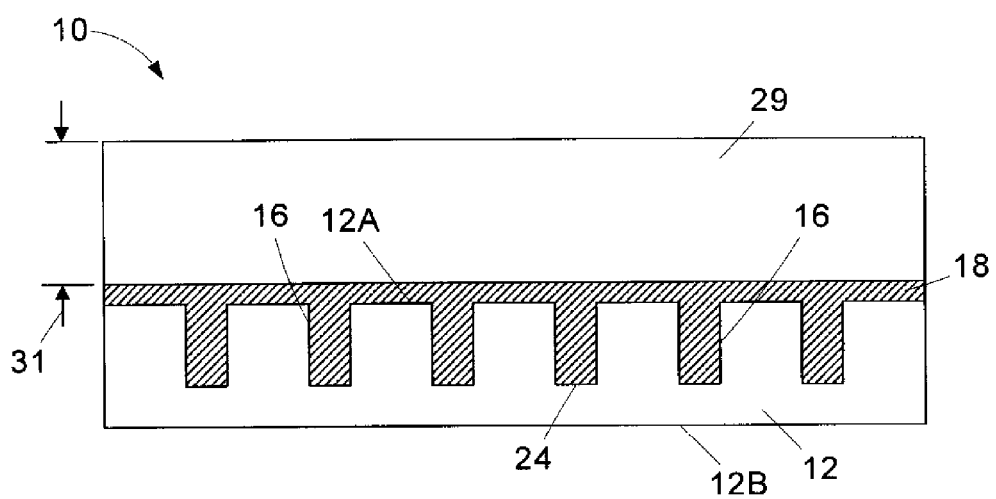
Figure 5:
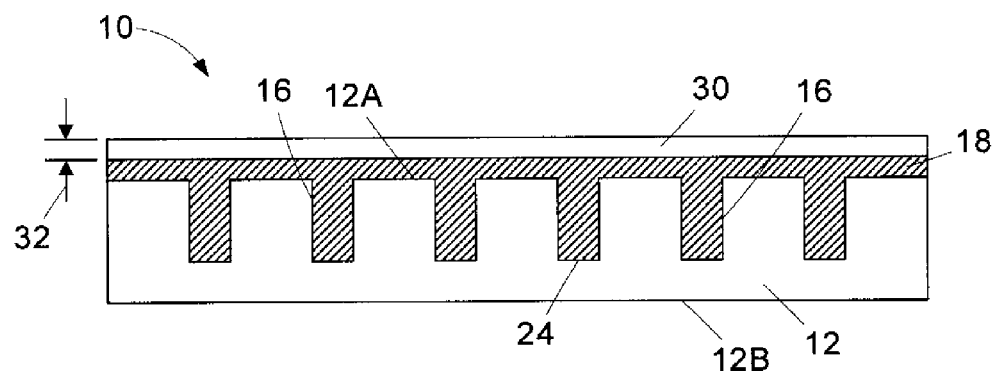

Ultimately, a thin substrate will be positioned or formed above the dissolvable material 18. The dissolvable material 18 is employed to secure the thin substrate to the carrier structure 12 either directly (e.g., when the dissolvable material 18 is an adhesive material) or indirectly (when the dissolvable material 18 is part of a multi-layer system). In one illustrative technique, the thin substrate is formed by reducing the original thickness of a semiconducting substrate. More specifically, as shown in FIG. 4, a semiconducting substrate 29, e.g., silicon, silicon-germanium, etc., having an original thickness 31 of approximately 700-1000 μm is secured to the dissolvable material 18. In this particular example, it is assumed that the dissolvable material 18 is an adhesive material. Thereafter, the thickness of the semiconducting substrate 29 is reduced, using known grinding, etching and/or chemical mechanical polishing processes, which results in the formation of the thin substrate 30, as shown in FIG. 5. The thickness 32 of the thin substrate 30 may vary depending upon the particular application, e.g., approximately 50-300 μm. Alternatively, the thin substrate 30 may be formed separately prior to attaching the thin substrate 30 to the carrier structure 12.

Figure 6:
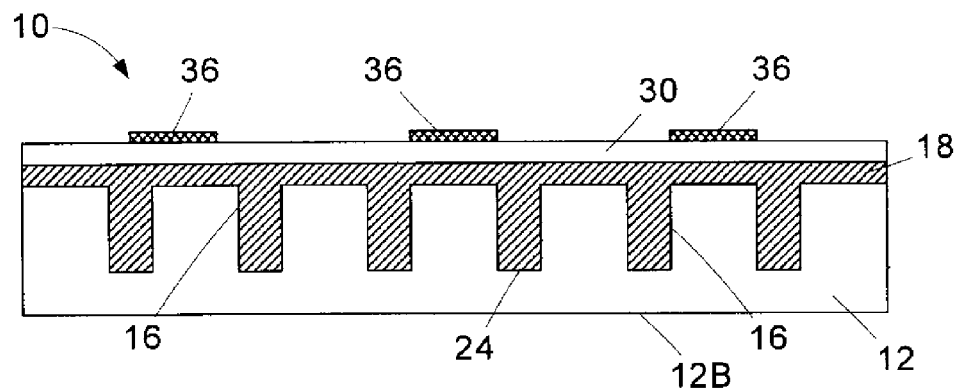

Then, as shown in FIG. 6, traditional processing operations are performed to form one or more schematically depicted integrated circuit structures 36 on the thin substrate 30. During such processing, the carrier structure 12 provides increased mechanical strength and rigidity to the thin substrate 30. The structures 36 may represent any type of semiconductor device, such as microprocessors, memory devices, etc., at some stage of manufacture Thus, the particular type or nature of the integrated circuit structures 36 formed on the thin substrate 30 should not be considered a limitation of the present disclosure.

Figure 7:
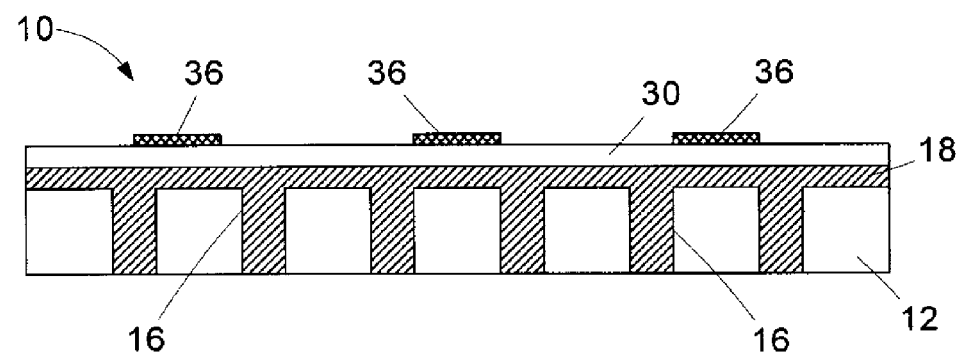
Figure 8:
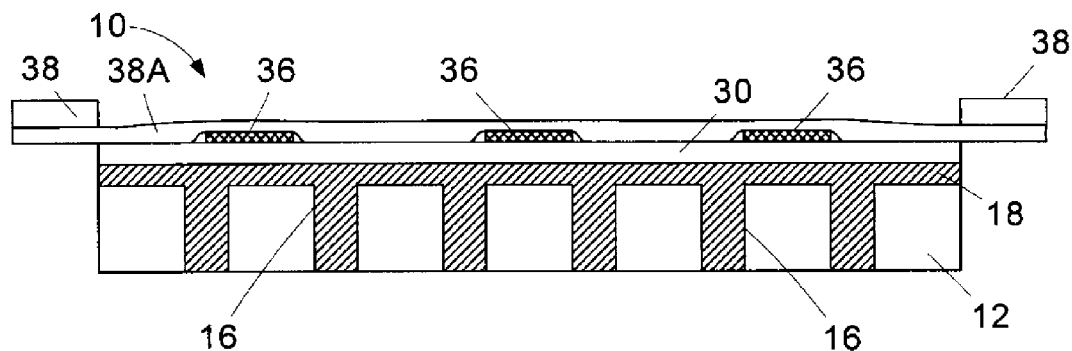

Then, as shown in FIG. 7, at least one process operation is performed to remove portions of the second side of the carrier structure 12 such that the dissolvable material 18 in the recesses 16 is exposed. Such an operation may be performed by using any of a variety of known back-grinding or etching techniques. In FIG. 8, a schematically depicted film frame or support device 38 is attached to the thin substrate 30. In some cases, the support device 38 may be attached by illustratively depicted tape 38A. In other case, tape alone may be employed as the support device 38 if desired. The support device 38 is attached to the thin substrate 30 so as to provide mechanical support to the thin substrate 30 when it is released from the carrier structure 12, as described more fully below.

Figure 9:
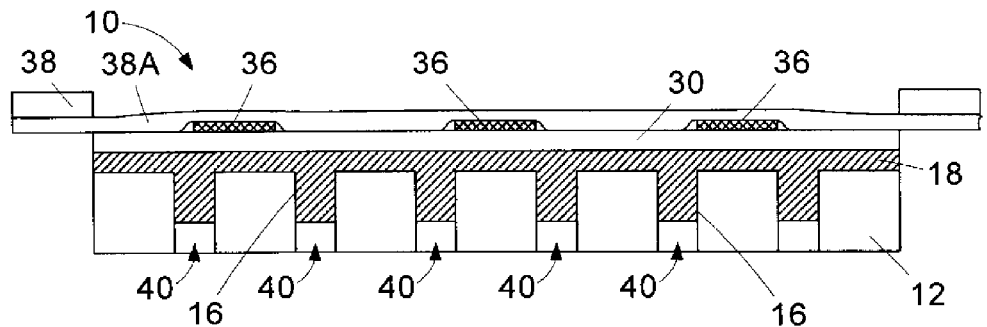
Figure 10:
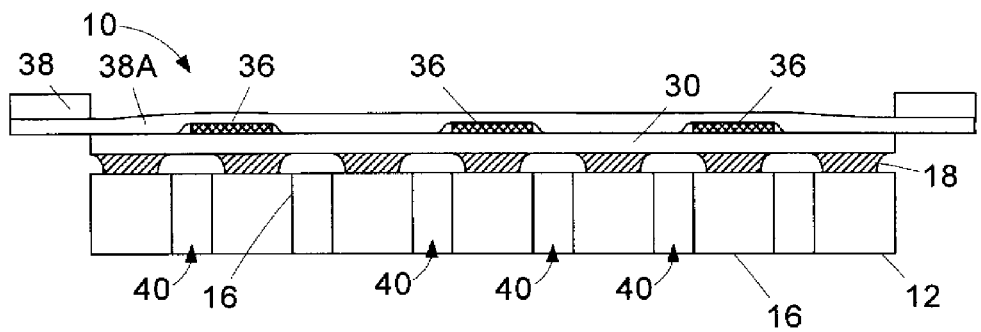
Figure 11:
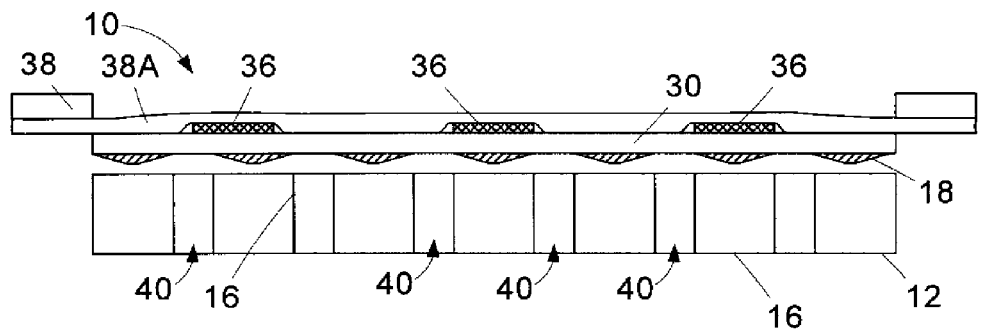

Next, as shown in FIGS. 9-11, a release agent 40, e.g., a solvent, an acid, water, etc., is allowed to contact the exposed dissolvable material 18. In one embodiment, the release agent 40 effectively dissolves the dissolvable material 18. FIGS. 9-11 depict the progression of the process as the release agent 40 dissolves the dissolvable material 18 thereby releasing the thin substrate 30 from the carrier structure 12. FIG. 11 schematically depicts the thin substrate 30 after it has been released from the carrier structure 12. Any residual material 18 on the thin substrate 30 may be removed by a variety of known techniques, e.g., a spin or scrub clean with sonic energy. The manner in which the release agent 40 is contacted with the dissolvable material 18 may vary depending upon the particular application. For example, the release agent 40 may be applied by a spraying process or the structure shown in FIG. 8 may be placed in a bath of the release agent 40. In general, the release agent 40 selected will depend upon the exact dissolvable material 18 selected for use. In one illustrative embodiment, the release agent 40 may be Acetone IPA, PGMEA, MEK, NMP, ammonium hydroxide, water, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a plurality of recesses in a carrier structure, the recesses extending to a depth that is less than a thickness of the carrier structure;
   forming a dissolvable material in the recesses and above a first surface of the carrier structure;
   securing a thin substrate above the first surface of the carrier structure using the dissolvable material to secure the thin substrate in place;
   performing at least one process operation on a second surface of the carrier structure to expose the dissolvable material in the recesses; and
   contacting the exposed dissolvable material with a release agent so as to dissolve at least a portion of the dissolvable material and release the thin substrate from the carrier structure.

2. The method of claim 1, further comprising attaching a support device to the thin substrate prior to contacting the exposed dissolvable material with the release agent.

3. The method of claim 1, further comprising, prior to performing the at least one process operation on the second surface of the carrier structure, forming a plurality of integrated circuit devices on the thin substrate.

4. The method of claim 3, wherein forming the dissolvable material comprises forming a single layer of dissolvable material and securing the thin substrate to the single layer of dissolvable material.

5. The method of claim 3, wherein forming the dissolvable material comprises forming a layer of dissolvable material in the recesses and above the first surface, forming a layer of adhesive material above the layer of dissolvable material and securing the thin substrate to the layer of adhesive material.

6. The method of claim 1, wherein contacting the exposed dissolvable material with a release agent comprises performing a spraying process to spray the release agent such that it contacts the exposed dissolvable material.

7. The method of claim 1, wherein contacting the exposed dissolvable material with a release agent comprises positioning the carrier structure in a bath comprising the release agent.

8. The method of claim 1, wherein the release agent comprises a solvent, an acid or water.

9. A method, comprising:
forming a plurality of recesses in a carrier structure, the recesses extending to a depth that is less than a thickness of the carrier structure;
forming a dissolvable adhesive material in the recesses and above a first surface of the carrier structure;
securing a thin substrate above the first surface of the carrier structure using the dissolvable adhesive material to secure the thin substrate in place;
performing at least one process operation on a second surface of the carrier structure to expose the dissolvable adhesive material in the recesses; and
contacting the exposed dissolvable adhesive material with a release agent so as to dissolve at least a portion of the dissolvable adhesive material and release the thin substrate from the carrier structure.

10. The method of claim 9, further comprising attaching a support device to the thin substrate prior to contacting the exposed dissolvable material with the solvent.

11. The method of claim 10, further comprising, prior to performing the at least one process operation on the second surface of the carrier structure, forming a plurality of integrated circuit devices on the thin substrate.

12. The method of claim 9, wherein the release agent is a solvent.

13. A method, comprising:
forming a plurality of recesses in a carrier structure, the recesses extending to a depth that is less than a thickness of the carrier structure;
forming a dissolvable material in the recesses and above a first surface of the carrier structure;
forming a layer of adhesive material on the dissolvable material;
securing a thin substrate above the first surface of the carrier structure using the layer of adhesive material to secure the thin substrate in place;
performing at least one process operation on a second surface of the carrier structure to expose the dissolvable material in the recesses; and
contacting the exposed dissolvable material with a release agent so as to dissolve at least a portion of the dissolvable material and release the thin substrate from the carrier structure.

14. The method of claim 13, further comprising attaching a support device to the thin substrate prior to contacting the exposed dissolvable material with the release agent.

15. The method of claim 13, further comprising, prior to performing the at least one process operation on the second surface of the carrier structure, forming a plurality of integrated circuit devices on the thin substrate.

16. A method, comprising:
forming a plurality of recesses in a carrier structure, the recesses extending to a depth that is less than a thickness of the carrier structure;
forming a dissolvable adhesive material in the recesses and above a first surface of the carrier structure;
attaching a semiconducting substrate to the dissolvable adhesive material, the semiconducting substrate having a thickness;
performing at least one process operation to reduce the thickness of the semiconducting substrate and thereby form a thin substrate;
performing at least one process operation on a second surface of the carrier structure to expose the dissolvable material in the recesses; and
contacting the exposed dissolvable material with a release agent so as to dissolve at least a portion of the dissolvable material and release the thin substrate from the carrier structure.

17. The method of claim 16, further comprising attaching a support device to the thin substrate prior to contacting the exposed dissolvable material with the solvent.

18. The method of claim 17, further comprising, prior to performing the at least one process operation on the second surface of the carrier structure, forming a plurality of integrated circuit devices on the thin substrate.

19. A method, comprising:
forming a plurality of recesses in a carrier structure, the recesses extending to a depth that is less than a thickness of the carrier structure;
forming a solvent-dissolvable adhesive material in the recesses and above a first surface of the carrier structure;
attaching a semiconducting substrate to the solvent-dissolvable adhesive material, the semiconducting substrate having a thickness less than 300 µm;
performing at least one process operation on a second surface of the carrier structure to expose the solvent-dissolvable material in the recesses; and
contacting the exposed solvent-dissolvable material with a solvent so as to dissolve at least a portion of the solvent-dissolvable material and release the semiconducting substrate from the carrier structure.

20. The method of claim 19, further comprising attaching a support device to the semiconducting substrate prior to contacting the exposed solvent-dissolvable material with the solvent.

21. The method of claim 19, further comprising, prior to performing the at least one process operation on the second surface of the carrier structure, forming a plurality of integrated circuit devices on the semiconducting substrate.

* * * * *